(12) United States Patent
Harnden et al.

(10) Patent No.: US 8,558,368 B2
(45) Date of Patent: *Oct. 15, 2013

(54) BI-DIRECTIONAL, REVERSE BLOCKING BATTERY SWITCH

(75) Inventors: James Harnden, Hollister, CA (US); Anthony Chia, Singapore (SG); Liming Wong, JiaDing (CN); Hongbo Yang, JiaDing (CN); Anthony C. Tsui, Saratoga, CA (US); Hui Teng, JiaDing (CN); Ming Zhou, Shanghai (CN)

(73) Assignee: GEM Services, Inc., Santa Clara, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 13/285,172

(22) Filed: Oct. 31, 2011

(65) Prior Publication Data

US 2012/0056261 A1   Mar. 8, 2012

Related U.S. Application Data

(63) Continuation of application No. 11/944,116, filed on Nov. 21, 2007, now Pat. No. 8,097,945.

(51) Int. Cl.
| | |
|---|---|
| H01L 23/48 | (2006.01) |
| H01L 29/66 | (2006.01) |
| H01L 23/62 | (2006.01) |
| H01L 23/34 | (2006.01) |
| H01L 23/52 | (2006.01) |
| H01L 29/40 | (2006.01) |
| H01L 29/00 | (2006.01) |
| H01L 21/336 | (2006.01) |

(52) U.S. Cl.
USPC ........... 257/697; 257/329; 257/355; 257/396; 257/723; 257/778; 257/787; 257/E23.024; 257/E23.061; 257/E23.116; 257/E23.175; 257/E23.178; 438/126; 438/268

(58) Field of Classification Search
None
See application file for complete search history.

(56) References Cited

U.S. PATENT DOCUMENTS

| | | | |
|---|---|---|---|
| 5,003,246 A | 3/1991 | Nadd | |
| 6,627,991 B1 | 9/2003 | Joshi | |

(Continued)

FOREIGN PATENT DOCUMENTS

| | | |
|---|---|---|
| JP | 08-032060 | 2/1996 |
| JP | 2002-141506 A | 5/2002 |

OTHER PUBLICATIONS

Japanese Patent Office, Notice of Reasons for Rejection for JP 2008-023416 dated Sep. 4, 2012, 6 pages.

*Primary Examiner* — Hoang-Quan Ho
(74) *Attorney, Agent, or Firm* — Kilpatrick Townsend & Stockton LLP

(57) ABSTRACT

Embodiments of the present invention relate to an improved package for a bi-directional and reverse blocking battery switch. According to one embodiment, two switches are oriented side-by-side, rather than end-to-end, in a die package. This configuration reduces the total switch resistance for a given die area, often reducing the resistance enough to avoid the use of backmetal in order to meet resistance specifications. Elimination of backmetal reduces the overall cost of the die package and removes the potential failure modes associated with the manufacture of backmetal. Embodiments of the present invention may also allow for more pin connections and an increased pin pitch. This results in redundant connections for higher current connections, thereby reducing electrical and thermal resistance and minimizing the costs of manufacture or implementation of the die package.

18 Claims, 7 Drawing Sheets

(56) References Cited

U.S. PATENT DOCUMENTS

| | | | |
|---|---|---|---|
| 7,095,099 B2 * | 8/2006 | Oliver et al. | 257/676 |
| 7,173,291 B2 * | 2/2007 | Asano | 257/173 |
| 7,250,672 B2 | 7/2007 | Pavier et al. | |
| 7,271,477 B2 * | 9/2007 | Saito et al. | 257/686 |
| 7,408,251 B2 * | 8/2008 | Hata et al. | 257/678 |
| 7,619,302 B2 * | 11/2009 | Hauenstein | 257/666 |
| 7,709,935 B2 * | 5/2010 | Islam et al. | 257/666 |
| 7,745,930 B2 * | 6/2010 | Connah et al. | 257/728 |
| 7,868,432 B2 | 1/2011 | Lee et al. | |
| 7,880,280 B2 | 2/2011 | Otremba | |
| 8,097,945 B2 * | 1/2012 | Harnden et al. | 257/697 |
| 2002/0096748 A1 | 7/2002 | Pavier | |
| 2004/0021233 A1 | 2/2004 | Kinzer et al. | |
| 2006/0118818 A1 | 6/2006 | Shimoida et al. | |
| 2007/0052076 A1 | 3/2007 | Ramos et al. | |
| 2007/0111374 A1 * | 5/2007 | Islam et al. | 438/106 |
| 2007/0273009 A1 * | 11/2007 | Hauenstein | 257/666 |
| 2009/0179265 A1 | 7/2009 | Harnden et al. | |

* cited by examiner

--Prior Art--

--Prior Art--

--Prior Art--

--Prior Art--

BI-DIRECTIONAL, REVERSE BLOCKING BATTERY SWITCH

CROSS-REFERENCES TO RELATED APPLICATIONS

The present application is a continuation of U.S. application Ser. No. 11/944,116, filed Nov. 21, 2007, of which the entire disclosure is incorporated herein by reference for all purposes.

BACKGROUND OF THE INVENTION

Battery life and battery size are two important features of battery powered devices. The goal of each battery charge is to perform "work": powering functions and features that add value, with minimal loss to house-keeping and safety circuits.

When potentially harmful or hazardous conditions arise, the battery may need to be disconnected. To disconnect the battery without reducing battery energy, battery disconnect switches are typically located in series with the battery.

FIG. 1 shows a simplified schematic diagram of a conventional reverse blocking battery switch 100 made up of two N-channel Metal Oxide Semiconductor Field Effect Transistors (MOSFETs) 108 and 109 (shown in FIG. 2). The N-channel MOSFETs include source inputs 101 and 106, and gate inputs 102 and 105.

The N-channel MOSFETs also include respective drains 103 and 104, which are connected by jumper 107. The two MOSFETs of the switch of FIG. 1 may be connected in a "common drain" configuration, utilizing an intrinsic body diode that inherently blocks the flow of current in one direction. Alternative configurations may be used, and other circuitry may be added to protect the various transistor inputs from static damage, or to level-shift the gate inputs 102 and 105.

FIG. 2 shows a perspective view of the mechanical construction of the conventional MOSFET, bi-directional switch configuration of FIG. 1. In this single package solution, common drains 103 and 104 are connected by die-attaching two standard MOSFETs 108 and 109 to a common copper die pad 107. Gates 102 and 105 are formed on the length-wise ends of the package. This configuration achieves both a direct thermal path for heat sinking, and a low electrical resistance connection between the drains 103 and 104, through the backside of vertical conduction MOSFETs 108 and 109.

FIG. 3 shows a simplified perspective view of a monolithic implementation of the conventional bi-directional switch of FIGS. 1-2. This configuration uses two MOSFETs built adjacent and joined to each other on the die pad 307. The MOSFETs are built commonly from two adjacent die 301 and 304 on a normal wafer layout, so the two die 301 and 304 are usually side-by-side, and the gate inputs 302 and 305 lie on the same end of the package. Although relatively easy to construct, the configuration of FIG. 3 does not fit a die package having an aspect ratio that is typically desired by manufacturers.

FIG. 4 shows a bi-directional switch in a 2×5 mm Dual Flat No Lead (DFN) package 400. This version of the bi-directional switch attempts to fit the die into a preferred package footprint. Since the aspect ratio of package 400 is 2×5 mm, the two MOSFETs are attached end-to-end.

However, this configuration renders the internal drain connection resistance high relative to the resistance of the vertical conduction MOSFETs. In order to make the series drain resistance tolerable, the backside of the die is die-attached to a copper die pad. This configuration allows for lower resistance by placing a copper plate (the die pad) in parallel with two bulk drain resistances. The die pad also serves as a common drain connection to external connectors.

While the above configurations are effective, there is a need in the art for a switch having improved characteristics.

BRIEF SUMMARY OF THE INVENTION

Embodiments of the present invention relate to an improved die layout for a bi-directional and reverse blocking battery switch. According to one embodiment, two switches are oriented side-by-side (as opposed to end-to-end) in a die package. This configuration reduces the total switch resistance for a give die area, often reducing the resistance enough to avoid the use of backmetal in order to meet resistance specifications. Elimination of backmetal reduces the overall cost of the die package, and removes the potential failure modes associated with manufacture of backmetal. Embodiments of the present invention also allow for more pin connections and for an increased pin pitch. This allows formation of redundant connections for higher current connections, thereby reducing electrical and thermal resistance, and minimizing the manufacture/implementation costs of the die package.

An embodiment of a method of packaging a integrated circuit having a first vertical MOSFET and a second vertical MOSFET includes encapsulating the integrated circuit within a package body. The package body has an outer surface with a first dimension and a second dimension longer than the first dimension. The method also includes disposing a first plurality of pin connections and a second plurality of pin connections along a length of the second dimension on respective opposite sides of the package body. Each of the first plurality of pin connections are electrically connected to one of a first plurality of contacts disposed on a single side of the first vertical MOSFET. The first plurality of contacts comprises a drain contact, a gate contact, and a source contact of the first vertical MOSFET. Additionally, each of the second plurality of pin connections are electrically connected to one of a second plurality of contacts disposed on a single side of the second vertical MOSFET. The second plurality of contacts comprises a drain contact, a gate contact, and a source contact of the second vertical MOSFET.

An embodiment of an integrated circuit package for an integrated circuit with a first vertical MOSFET and a second vertical MOSFET includes a package body encapsulating the integrated circuit. The package body has an outer surface with a first dimension and a second dimension longer than the first dimension. The integrated circuit package also includes a first plurality of pin connections and a second plurality of pin connections disposed along a length of the second dimension on respective opposite sides of the package body. Each of the first plurality of pin connections are electrically connected to one of a first plurality of contacts disposed on a single side of the first vertical MOSFET. The first plurality of contacts comprises a drain contact, a gate contact, and a source contact of the first vertical MOSFET. Additionally, each of the second plurality of pin connections are electrically connected to one of a second plurality of contacts disposed on a single side of the second vertical MOSFET. The second plurality of contacts comprises a drain contact, a gate contact, and a source contact of the second vertical MOSFET.

A further understanding of embodiments in accordance with the present invention can be made by way of reference to the ensuing detailed description taken in conjunction with the accompanying drawings.

DETAILED DESCRIPTION OF THE INVENTION

Embodiments of the present invention relate to an improved die layout for a bi-directional and reverse blocking battery switch. According to one embodiment, two switches are integrated in a common bulk Drain, side-by-side (as opposed to end-to-end) in a die package. This configuration reduces the total switch resistance, and often avoids the use of backmetal in order to meet resistance specifications. Elimination of backmetal reduces the overall cost of the die package, and removes the potential failure modes associated with the manufacture of backmetal.

Embodiments of the present invention may also allow for more pin connections and for an increased pin pitch. This results in redundant connections for higher current connections, thereby reducing the electrical and thermal resistance, and minimizing the manufacture/implementation costs of the die package. Embodiments in accordance with the present invention can also exhibit a size and form factor that fits battery cells, a low resistance that will fit in an allowable die footprint, a configuration that provides reliability with the battery assembly and use, and low thermal impedance to sink internally generated heat.

One change that can be made to a conventional die layout, is the use of a "sinker" structure to move the contact with the common drain to the opposite side of the die. Such sinker structures are commonly used to contact the bulk or substrate region in ICs, but they have also found use in power products. Since power products generally need low resistance connections to all nodes, a sinker would consume a large area in order to have comparable resistance to an active device.

Figure 5A:
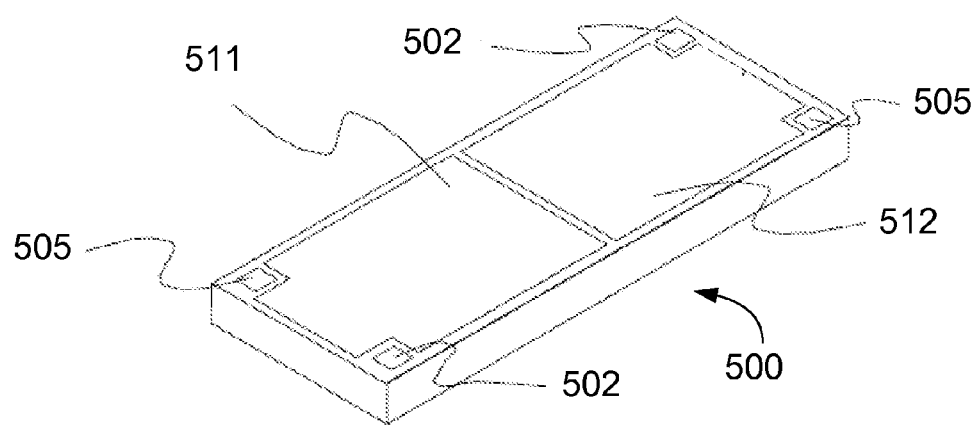
FIG. 5A shows a simplified perspective view of a monolithic bi-directional switch with a "sinker" connected to a common drain.
Figure 5B:
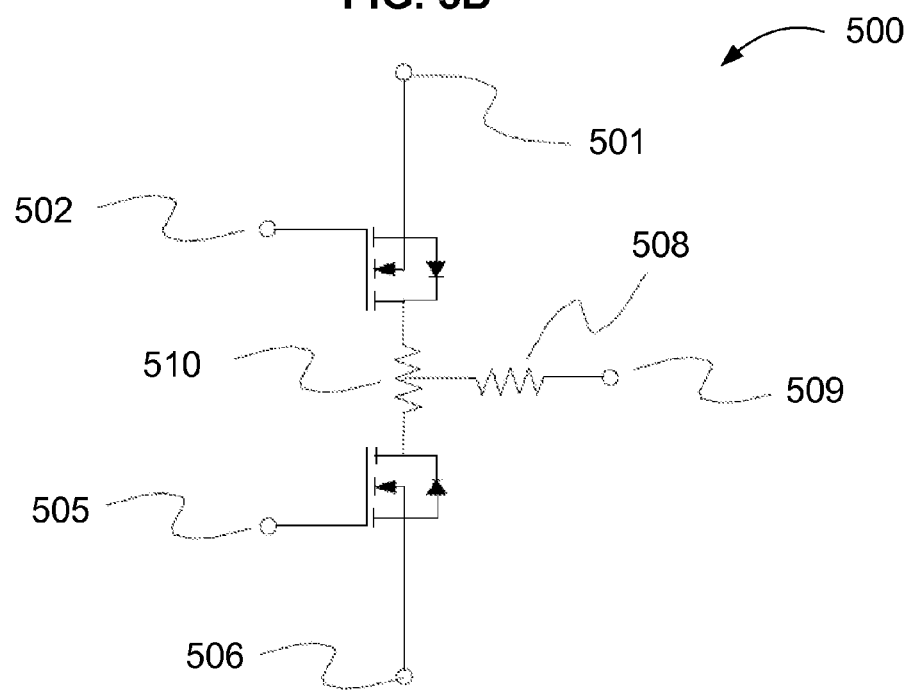
FIG. 5B shows a simplified electrical schematic of the package of FIG. 5A.

FIGS. 5A and 5B illustrate perspective and circuit schematic views respectively, or such a configuration, where a monolithic bi-directional switch 500 has a "sinker" to a common drain connection. Resistance 510 is the series resistance of the common drain connection that connects the two vertical MOSFETs 511 and 512, which include gate inputs 502 and 505, and source inputs 501 and 506.

The common drain connection is achieved by integrating two devices in a conductive common "bulk" drain area on the wafer. Though the common "bulk" drain area is conductive, the series resistance is not as low as the series resistance of a package using backmetal.

Moreover, resistor 508 represents the series resistance of the "sinker", which is in series with an outside node 509 and directly in series with the two MOSFET switches 511 and 512. In most cases, this node is used to monitor the voltage of the common drain connection, which is not a high current path that can cause significant inaccuracies even if a sinker of minimal area is employed.

The conventional arrangement utilizing a sinker structure shown in FIGS. 5A and 5B, allows all of the contacts of the package pins and external connectors to be made on one side of the die. In this configuration, however, the drain region has low resistance between the two active vertical MOSFETs, and the common drain area does not yield a high external current connection. Moreover, the drain connection is primarily used to monitor the voltage, which can tolerate large series resistance without corrupting the readings.

Other conventional methods exist to position the drain connection to the same side as the gate and source, such as drilling, etching, and/or plating or filling the hole with copper, solder, or a tri-metal similar to that used on the backside of a MOSFET wafer. However, these methods may not be cost effective, especially for an application that does not require extremely low resistance for the common drain connection to external connectors.

Figure 6A:
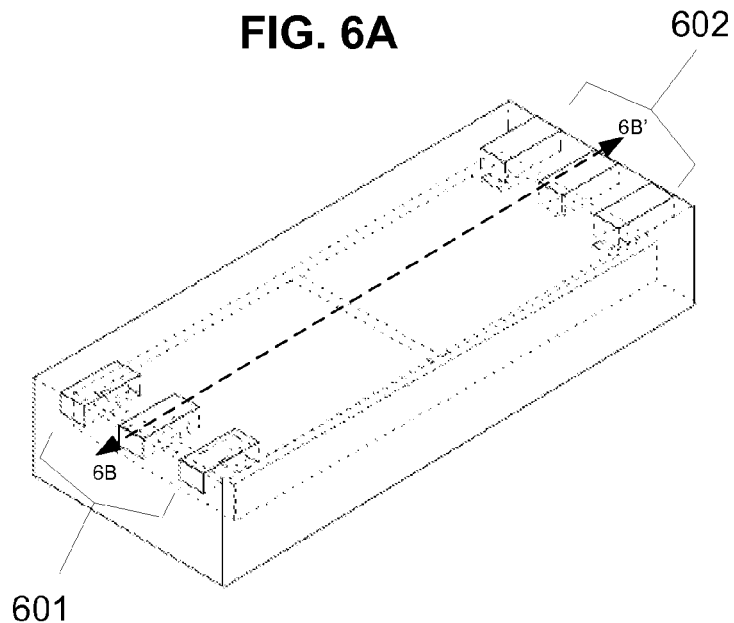
FIG. 6A shows a simplified perspective view of a bump on leadframe implementation of a monolithic bi-directional switch in 2×5 mm Dual Flat No Lead package.
Figure 6B:
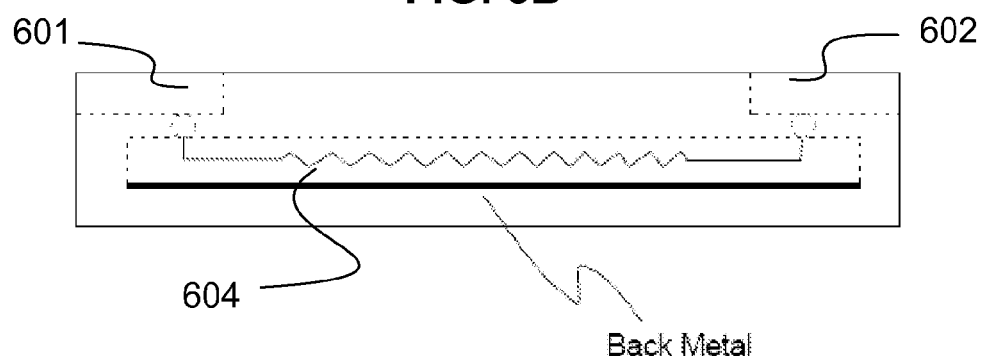
FIG. 6B shows a simplified side view of the package of FIG. 6A.

FIG. 6A is a simplified perspective view, and FIG. 6B is a side view, of an implementation of a conventional bump on leadframe ("BOL") of the monolithic bi-directional switch of FIGS. 5A and 5B, packaged in an existing 2×5 mm DFN package. Though this arrangement can be connected via an existing 2×5 mm DFN style package, this configuration is not a significant improvement over existing products.

Specifically, the die layout of the embodiment of FIGS. 6A and 6B still positions the two MOSFET switches 601 and 602 end-to-end. This maximizes and distributes the series drain resistance 604 common to the two switches 601 and 602, thereby increasing the total resistance and necessitating addition of backmetal, a copper slug, or some other low resistance parallel conduction layer. In addition, the package contact layout at the two ends forces the die contacts for external connectors, to be routed to the ends of the die, an inefficient use of die area.

Figure 7A:
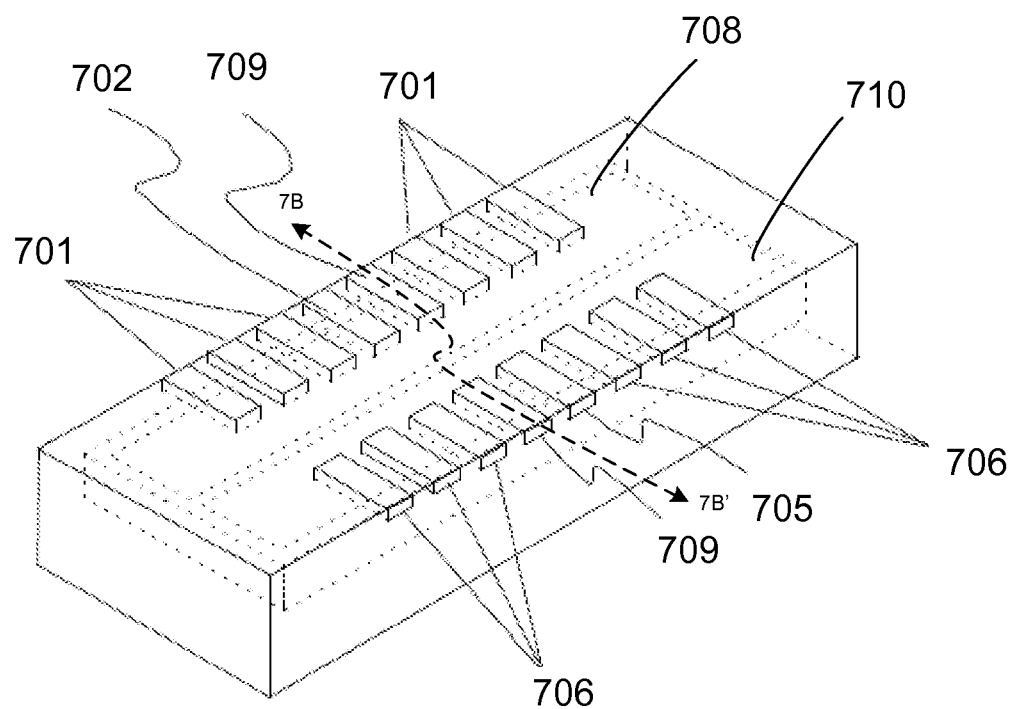
FIG. 7A shows a simplified perspective view of an improved die layout according to an embodiment of the present invention.
Figure 7B:
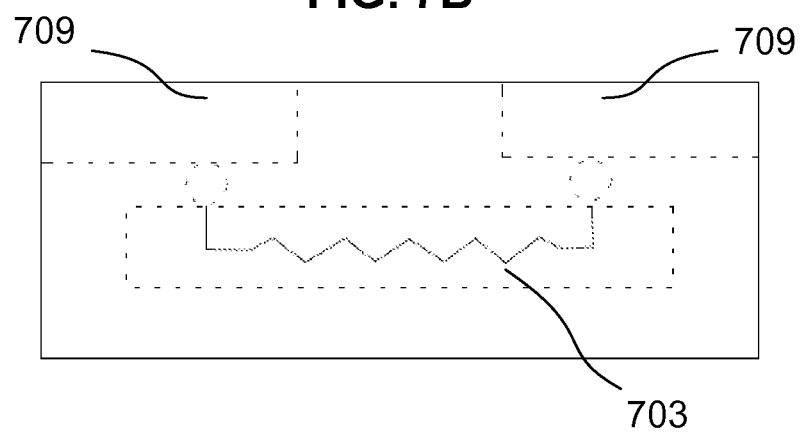
FIG. 7B shows a simplified cross-section view of the improved die layout of FIG. 7A.
Figure 7C:
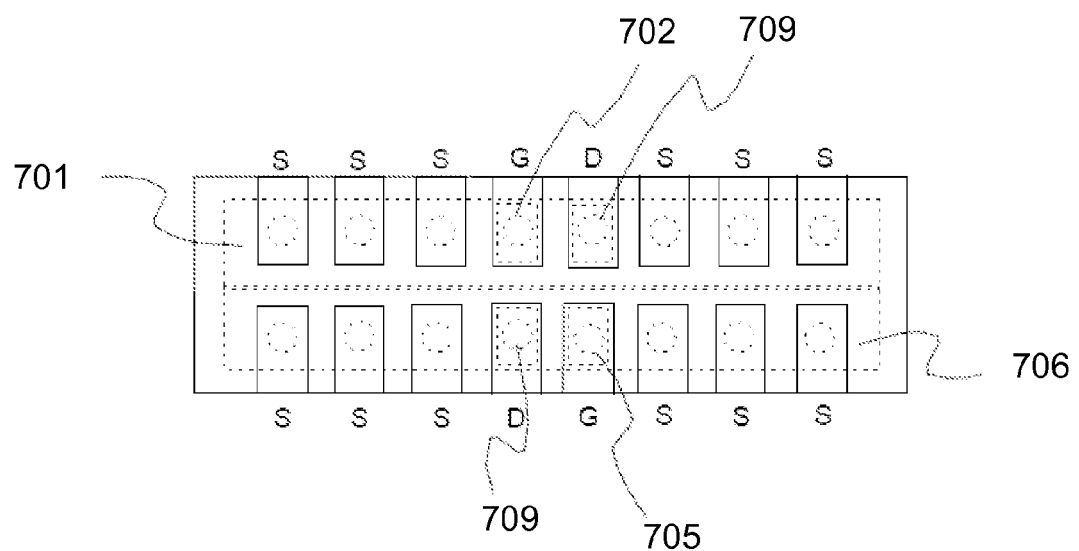
FIG. 7C shows a simplified bottom view of the improved die layout of FIG. 7A.

Accordingly, FIG. 7A is a simplified perspective view, FIG. 7B a simplified end view, and FIG. 7C a simplified bottom view, of an embodiment die layout according to the present invention. In this embodiment, the die is laid out so that the two switches 708 and 710 occupy the same overall die area as in the package of FIG. 6A, but are oriented side-by-side instead of end to end. The die package according to embodiments of the present invention can be built using a DFN, ChipScale, or even J-lead technology. The two switches 708 and 710 include respective gate inputs 702 and 705, source inputs 701 and 706, and common drain connection 709 (i.e. the common "bulk" drain).

FIG. 7B is a simplified schematic view from the end of the die layout of FIG. 7A. FIG. 7B shows that the series drain resistance 703, is smaller than the series drain resistance 604 of the conventional arrangement shown in FIG. 6B. Specifically, with everything else remaining the same, the configuration of the embodiments of FIGS. 7A-C will reduce total resistance of the blocking battery switch by a factor of the length times width ratio. Here, the length times width ratio is half the length and twice the width (two squares in series vs. two squares in parallel), or one-fourth the total switch resistance.

The reduction in series drain and source resistance achieved by embodiments in accordance with the present invention, may in turn sufficiently reduce the drain bulk resistance, to avoid having to use backmetal in order to meet the resistance specification limits. Such elimination of backmetal reduces the costs and potential failure modes associated with backmetal manufacturing.

Ultimately, embodiments of the present invention may allow for more and/or wider pins, and increased pin pitch. This allows redundant connections to be provided for the higher current connections. The wider and increased number of pins, may also help to reduce electrical and thermal resistance, and help to prevent marginal connections from being catastrophic. Additionally, die packages that do not push the limits on pin pitch, tend to be less expensive to implement and manufacture.

Figure 1:
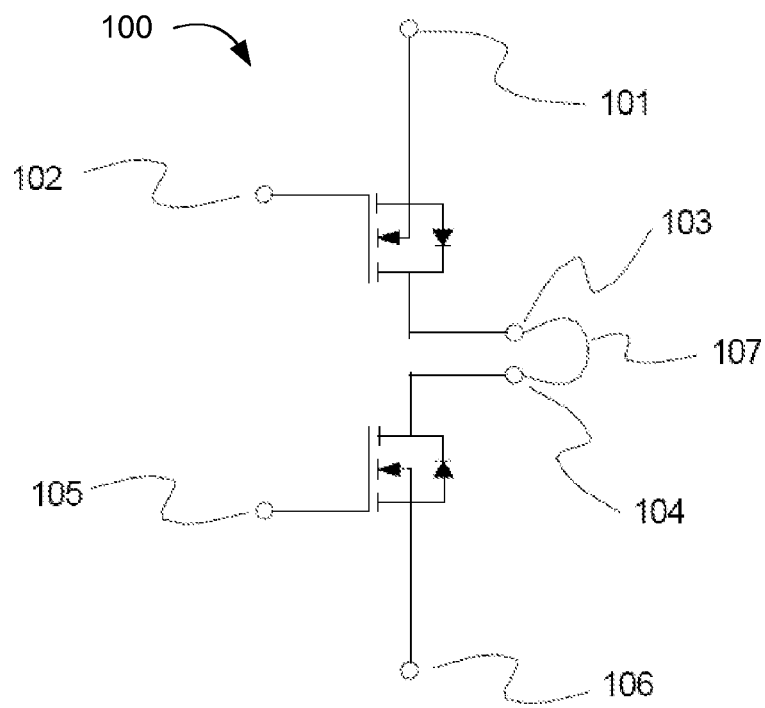
FIG. 1 shows a simplified circuit schematic of a conventional reverse blocking battery switch made up of two ordinary N-channel MOSFETs.
Figure 2:
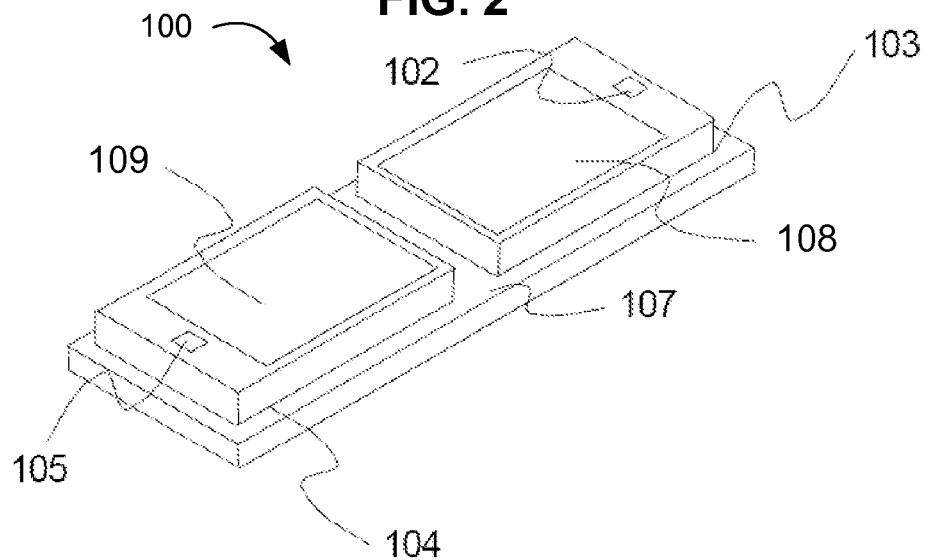
FIG. 2 shows a simplified perspective view of a conventional MOSFET attachment in a dual-MOSFET, bi-directional switch configuration.
Figure 3:
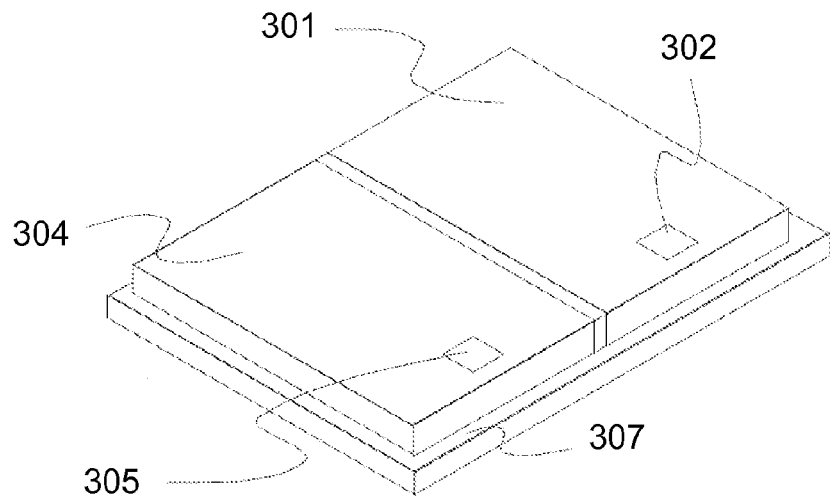
FIG. 3 shows a simplified perspective view of a monolithic implementation of a conventional bi-directional switch configuration.
Figure 4:
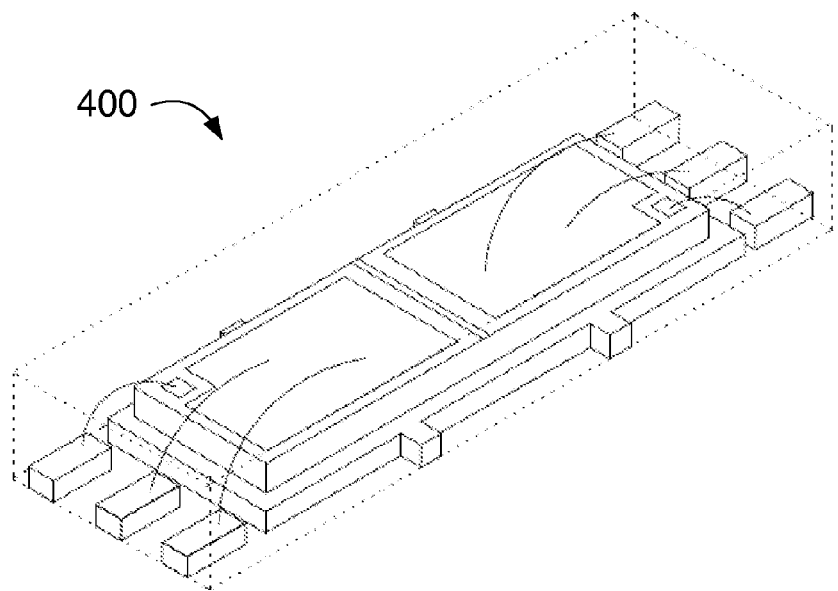
FIG. 4 shows a simplified perspective view of a conventional bi-directional switch in a 2×5 mm Dual Flat No Lead package.
Figure 7D:
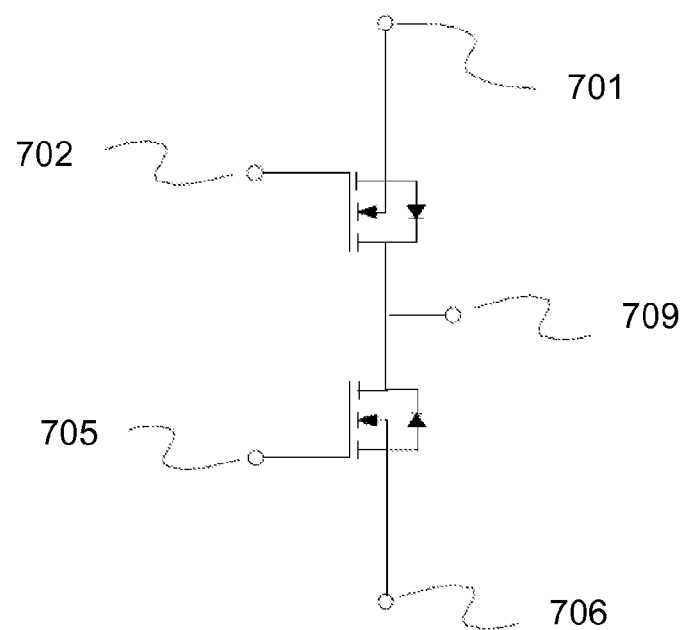
FIG. 7D show a simplified electrical schematic of the improved die layout of FIG. 7A.

FIG. 7D shows a simplified electrical schematic of the improved die layout of the embodiment of FIGS. 7A-7C. Unlike the conventional die package of FIG. 1, the common drain area of FIG. 7D does not require a jumper to connect two common drains. Moreover, the pins are oriented so that the same pin pattern is repeated on either side, for either switch, thereby making the die package reversible. Such an arrangement removes an orientation step during testing of the package, and during assembly of the package on the PC board.

Figure 8A:
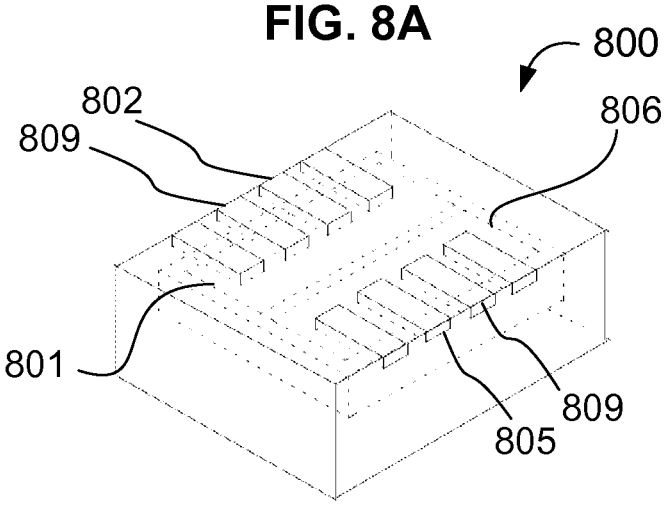
FIG. 8A is a simplified perspective view of a higher resistance switch on a smaller die layout according to an embodiment of the present invention.
Figure 8B:
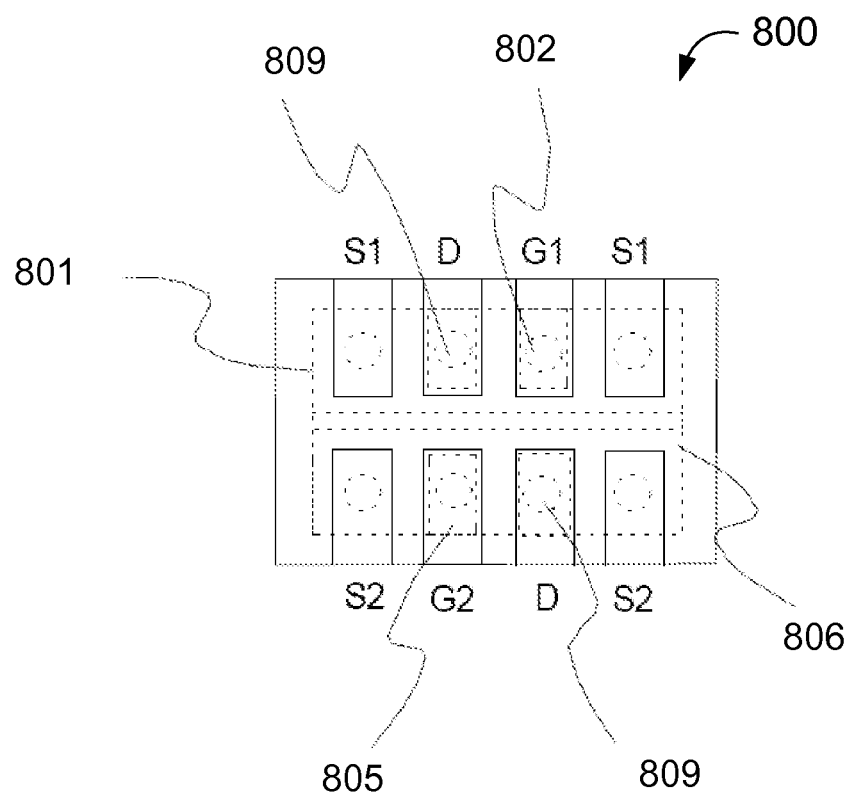
FIG. 8B is a simplified bottom view of the die layout of FIG. 8A.

FIG. 8A is simplified perspective view, and FIG. 8B is a top view, of a smaller, higher resistance switch 800 according to an alternative embodiment of the present invention. The switch of FIGS. 8A and 8B is positioned on a smaller die layout.

By locating the gate connections 802 and 805 and the common drain connections 809 at the center of the package, and then reversing them side-to-side, the package becomes reversible. Thus, if the package is turned 180 degrees, the gate, source, and drain connections would remain in the same place along each side of the package.

Moreover, the number of source connections 801 and 806 on either end is a function of the die size, and therefore a ratio of the switch resistance. Accordingly, the embodiment of FIGS. 8A-8B reduces thermal and electrical resistance, and allows for efficient use of the die area.

While the above is a full description of the specific embodiments in accordance with the present invention, various modifications, and alternative constructions and equivalents may be used. For example, while the embodiments shown in FIGS. 7A-8B utilize MOSFETs present in a monolithic structure, this is not required by the present invention. According to alternative embodiments, the MOSFETs of the switch could be present in discrete die. In such embodiments, a common drain between the MOSFET devices of the adjacent die could be established through a backmetal or other conducting layer such as a die pad.

In view of the above, the description and illustrations should not be taken as limiting the scope of the present invention which is defined by the appended claims.

What is claimed is:

1. A method of packaging an integrated circuit having a first vertical MOSFET and a second vertical MOSFET, the method comprising:
    encapsulating the integrated circuit within a package body, the package body having an outer surface with a first dimension and a second dimension longer than the first dimension; and
    disposing a first plurality of pin connections and a second plurality of pin connections along a length of the second dimension on respective opposite sides of the package body, such that:
        each of the first plurality of pin connections are electrically connected to one of a first plurality of contacts disposed on a single side of a semiconductor die in which the first vertical MOSFET is disposed, the first plurality of contacts comprising a drain contact, a gate contact, and a source contact of the first vertical MOSFET; and
        each of the second plurality of pin connections are electrically connected to one of a second plurality of contacts disposed on a single side of a semiconductor die in which the second vertical MOSFET is disposed, the second plurality of contacts comprising a drain contact, a gate contact, and a source contact of the second vertical MOSFET.

2. The method of claim 1 further comprising providing the first vertical MOSFET and the second vertical MOSFET monolithically in a single substrate.

3. The method of claim 1 further comprising providing the first vertical MOSFET and the second vertical MOSFET as separate semiconductor die.

4. The method of claim 1 wherein the package body conforms to a specification selected from DFN, ChipScale, or J-lead.

5. The method of claim 1 wherein the first vertical MOSFET and the second vertical MOSFET are electrically connected to form a reverse blocking battery switch.

6. The method of claim 1 wherein disposing the first plurality of pin connections and the second plurality of pin connections includes disposing the first plurality of pin connections to be electrically symmetrical with respect to the second plurality of pin connections, if the package body is turned 180 degrees.

7. The method of claim 1 further comprising providing drains of the first vertical MOSFET and the second vertical MOSFET that are not electrically connected through a backmetal.

8. The method of claim 1 further comprising providing drains of the first vertical MOSFET and the second vertical MOSFET that are electrically connected through a backmetal.

9. The method of claim 1 further comprising providing either or both the first vertical MOSFET or the second vertical MOSFET with more than one source contact, drain contact, or gate contact.

10. An integrated circuit package for an integrated circuit with a first vertical MOSFET and a second vertical MOSFET, the integrated circuit package comprising:
    a package body encapsulating the integrated circuit, the package body having an outer surface with a first dimension and a second dimension longer than the first dimension; and a first plurality of pin connections and a second plurality of pin connections disposed along a length of the second dimension on respective opposite sides of the package body, such that:

each of the first plurality of pin connections are electrically connected to one of a first plurality of contacts disposed on a single side of a semiconductor die in which the first vertical MOSFET is disposed, the first plurality of contacts comprising a drain contact, a gate contact, and a source contact of the first vertical MOSFET; and each of the second plurality of pin connections are electrically connected to one of a second plurality of contacts disposed on a single side of a semiconductor die in which the second vertical MOSFET is disposed, the second plurality of contacts comprising a drain contact, a gate contact, and a source contact of the second vertical MOSFET.

11. The integrated circuit package of claim 10 wherein the first vertical MOSFET and the second vertical MOSFET are provided monolithically in a single substrate.

12. The integrated circuit package of claim 10 wherein the first vertical MOSFET and the second vertical MOSFET are provided as separate semiconductor die.

13. The integrated circuit package of claim 10 wherein the package body conforms to a specification selected from DFN, ChipScale, or J-lead.

14. The integrated circuit package of claim 10 wherein the first vertical MOSFET and the second vertical MOSFET are electrically connected to form a reverse blocking battery switch.

15. The integrated circuit package of claim 10 wherein the first plurality of pin connections are disposed in the package body to be electrically symmetrical with respect to the second plurality of pin connections if the package body is turned 180 degrees.

16. The integrated circuit package of claim 10 wherein drains of the first vertical MOSFET and the second vertical MOSFET are not electrically connected through a backmetal.

17. The integrated circuit package of claim 10 wherein drains of the first vertical MOSFET and the second vertical MOSFET are electrically connected through a backmetal.

18. The integrated circuit package of claim 10 wherein either or both the first vertical MOSFET or the second vertical MOSFET have more than one source contact, drain contact, or gate contact.

* * * * *